United States Patent

Philippe et al.

[11] Patent Number: 5,937,340
[45] Date of Patent: Aug. 10, 1999

[54] INTEGRATED OSCILLATOR AND RADIO TELEPHONE USING SUCH AN OSCILLATOR

[75] Inventors: Pascal Philippe; Mihaï Murgulescu; Fabrice Jovenin, all of Caen, France

[73] Assignee: U.S. Philips Corporation, New York, N.Y.

[21] Appl. No.: 08/946,483

[22] Filed: Oct. 7, 1997

[30] Foreign Application Priority Data

Oct. 10, 1996 [FR] France ................................... 96 12380

[51] Int. Cl.$^6$ ....................................................... H04B 1/10
[52] U.S. Cl. .......................... 455/310; 455/264; 455/318; 331/177 V; 331/108 C; 331/108 R
[58] Field of Search .................................. 455/73, 75–76, 455/87, 550, 575, 255–256, 257, 258–264, 265, 310, 318–322, 334; 331/177 V, 143, 144, 111, 107 R, 108 R, 108 C, 177 R, 113 R; 332/136

[56] References Cited

U.S. PATENT DOCUMENTS 5,231,361  7/1993  Smith et al. ......................... 331/177 V
5,486,796  1/1996  Ishikawa et al. ........................ 455/262
5,629,652  5/1997  Weiss .................................. 331/177 V

FOREIGN PATENT DOCUMENTS 0660504  6/1995  European Pat. Off. .......... H03B 5/12

OTHER PUBLICATIONS

"A Monolithic GaAs IC for Heterodyne Generation of RF Signals" by Mr. Rory L. Van Tuyl, published in IEEE Transactions on Electron Devices, vol. ED–28, No. 2.

Primary Examiner—Doris H. To
Attorney, Agent, or Firm—Dicran Halajian

[57] ABSTRACT

The invention relates to an oscillator OSC intended to provide an output signal having a frequency which is variable as a function of a tuning voltage Vtun. The oscillator OSC includes a passive part having two series-arranged variable capacitances Cs, biased by the tuning voltage Vtun, and connected to a power supply VCC via two inductances Lext, and an active part having a first transistor T1 and a second transistor T2 whose collectors are connected to the output terminals C1 and C2 of the passive part, the base of one transistor being connected to the collector of the other transistor via a coupling capacitor Cfb. According to the invention, the passive part includes two high-pass filters, each being inserted between one of the output terminals S1 or S2 and one of the variable capacitances Cs, which allows a reduction of the active part's sensitivity to low-frequency noise.

11 Claims, 2 Drawing Sheets

INTEGRATED OSCILLATOR AND RADIO TELEPHONE USING SUCH AN OSCILLATOR

BACKGROUND OF THE INVENTION

The invention relates to an oscillator intended to provide an output signal having a frequency which is variable as a function of a tuning voltage, comprising:

a passive part having two output terminals between which the output signal is taken, and an input terminal intended to receive the tuning voltage, and comprising two series-arranged variable capacitances, thus forming a capacitive branch whose extremities constitute the output terminals, and of which a junction point between the variable capacitances constitutes the input terminal, the output terminals being connected to a first power supply terminal via two inductances having equal nominal values, an active part comprising a first and a second transistor each having a biasing terminal, a reference terminal and an output terminal, the output terminals of the first and second transistors being connected to the output terminals of the passive part, the reference terminals of said transistors being connected to a second power supply terminal via a current source, the biasing terminals of the first and second transistors being connected to the output terminals of the second and first transistors, respectively, via two coupling capacitances having equal nominal values.

Such an oscillator is known from the article "A Monolithic GaAs IC for Heterodyne Generation of RF Signals" by Mr Rory L. van Tuyl, published in IEEE Transactions on Electron Devices, vol. ED-28, No. 2. The transistors in this oscillator are realized in gallium arsenide, which gives them the advantage of rapidity. However, these transistors generate a considerable low-frequency noise, which is a major drawback in radiotelephone applications in which the frequency of the output signal of the oscillator is used for selecting a radio-electric signal from a range of given frequencies. The signal generated by the oscillator must have high spectral purity, which cannot be obtained by means of gallium arsenide transistors.

A larger spectral purity may be obtained by using bipolar transistors connected as differential pairs in accordance with the description in the opening paragraph. When used in a portable telephone of, for example the GSM type, such an oscillator receives a regulated power supply voltage elaborated on the basis of a voltage which is present at the terminals of a battery included in this telephone. This regulated voltage has, by nature, low-frequency variations which may reach in the passive part of the oscillator and alter the spectral purity of the signal generated by this oscillator.

SUMMARY OF THE INVENTION

It is an object of the invention to remedy this drawback by providing an oscillator having an active part which is realized by means of bipolar transistors and in which the sensitivity of the passive part to variations of the power supply voltage is considerably reduced.

According to the invention, an oscillator of the type described in the opening paragraph is therefore characterized in that, the first and second transistors being bipolar transistors whose bases, collectors and emitters constitute the biasing terminals, the output terminals and the reference terminals, respectively, the passive part comprises two high-pass filters, each being inserted between one of the output terminals and one of the variable capacitances.

The use of high-pass filters has for its effect to isolate the active part of the oscillator from low-frequency variations of the power supply voltage.

In an advantageous embodiment of the invention, an oscillator as described above is characterized in that each high-pass filter is constituted by a filtering capacitor arranged between one of the output terminals and one of the variable capacitances, and a resistor arranged between the second power supply terminal and a node situated between said variable capacitance and the filtering capacitor.

This simple structure of high-pass filters allows a good protection of the active part against low-frequency signals, while only requiring a reduced surface for its implementation.

The current source of the differential pair may also constitute a source of low-frequency noise. A particular embodiment of the invention thus provides an oscillator as described above which is characterized in that the current source connecting the reference terminals of the first and second transistors to the second power supply terminal is a resistor.

Besides the advantage of the simplicity of this embodiment, which results in an economy of surface, this resistance-based current source also has the advantage that it generates less low-frequency noise than the biasing circuit of a transistorized current source.

In the majority of portable applications, it is desirable to reduce the bulkiness of electronic circuits in order to reduce the weight and volume of the apparatuses containing the circuits. An advantageous embodiment of the invention allows reduction of the oscillator to a single integrated circuit, enclosed in a connection housing. Such an oscillator is characterized in that, the active and passive parts being realized within the same integrated circuit incorporated in a housing having a first and a second pin constituting the first and second power supply terminals and pins connected to the input and output terminals of the integrated circuit, the inductances are constituted by conducting wires connecting the output terminals of the passive part to the first pin of the housing.

The intrinsic inductance of the wires establishing the electric connections between the pins of the housing and the terminals of the integrated circuit is utilized in this case. It enables to avoid the addition of external inductances to the housing incorporating the oscillator and results in a simpler insertion of the oscillator within the apparatus using this oscillator. The development and manufacture of such an apparatus are thus simplified, which reduces its total cost.

As has been demonstrated hereinbefore, such an oscillator is particularly well adapted to its use within portable apparatuses. The invention thus also relates to a radiotelephone apparatus used for emitting or receiving radio-electric signals in a given range of frequencies, which apparatus comprises an antenna and filtering system allowing reception of a signal having a frequency which is selected within said range of frequencies, in which apparatus a frequency conversion, from the frequency to be selected to an intermediate frequency, is realized by means of a mixer receiving the selected radio-electric signal and a signal emitted at the output of a local oscillator of the type described above, said signal having a frequency which is measured by a control module which supplies a tuning voltage at the output allowing control of the frequency of the output signal of the local oscillator of such that said frequency is equal to the difference between the frequency to be selected and the intermediate frequency.

These and other aspects of the invention are apparent from and will be elucidated with reference to the embodiments described hereinafter.

DESCRIPTION OF THE PREFERRED EMBODIMENTS

Figure 1:
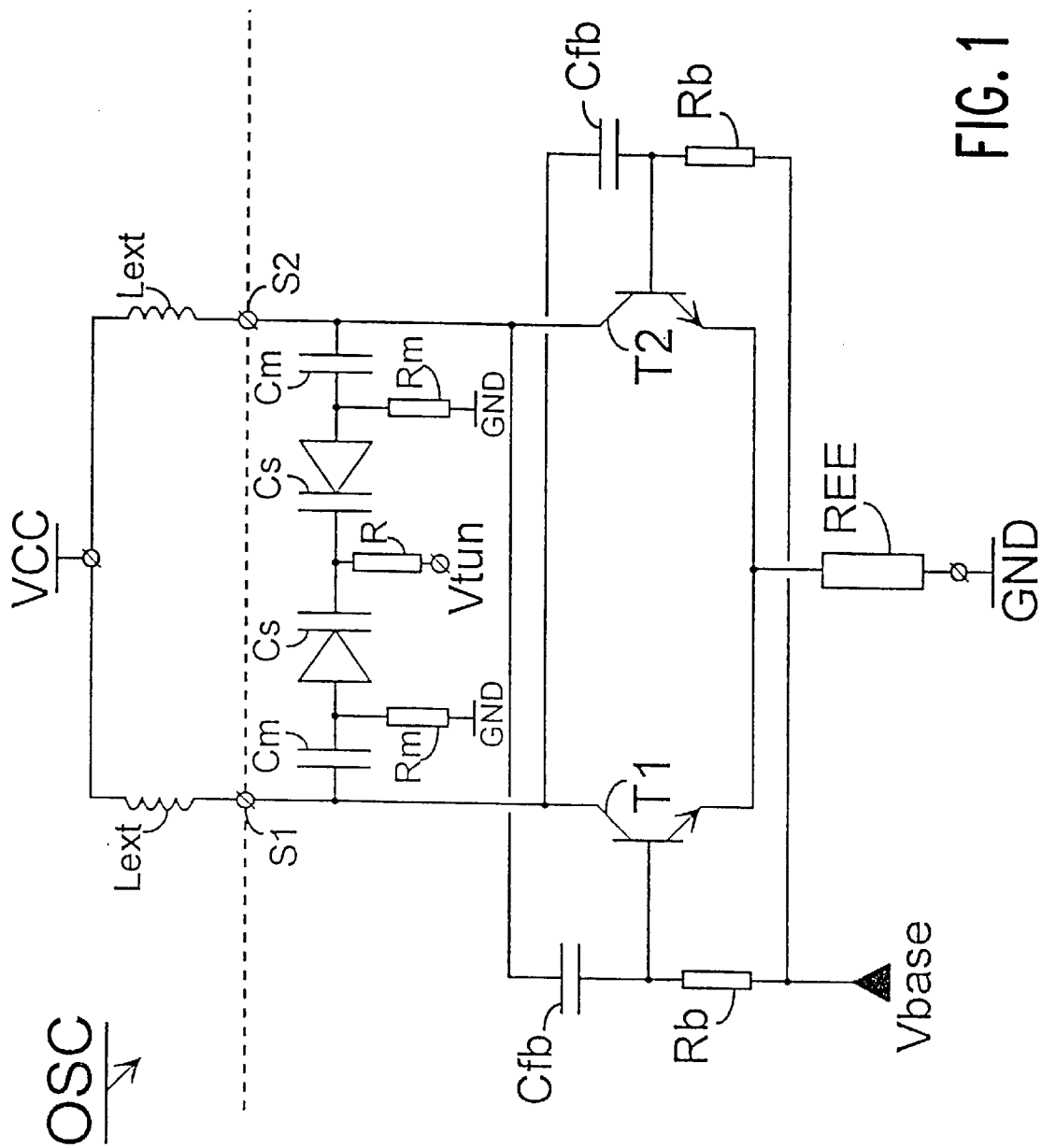
FIG. 1 is a partial electric circuit diagram of an oscillator according to the invention.

FIG. 1 shows diagrammatically an oscillator OSC intended to deliver an output signal LO having a frequency which is variable as a function of a tuning voltage Vtun. The oscillator OSC comprises a passive part which has two output terminals S1 and S2 between which the output signal LO is taken, and an input terminal intended to receive the tuning voltage Vtun. The passive part comprises two series-arranged variable capacitances Cs, thus forming a capacitive branch whose extremities constitute the output terminals S1 and S2. Here, these capacitances are realized in the form of reverse-biased Schottky diodes. The junction point between the variable capacitances Cs is connected via a resistor R to the input terminal and the output terminals S1 and S2 are connected to a first power supply terminal VCC via two inductances Lext having equal nominal values. The oscillator OSC also has an active part comprising a first bipolar transistor T1 and a second bipolar transistor T2 each having a base, an emitter and a collector. The collectors of the first and second transistors T1 and T2 are connected to the output terminals S1 and S2 of the passive part. The emitters of said transistors T1 and T2 are connected to a second power supply terminal GND via a current source constituted by a resistor REE in this case. The bases of the first and second transistors T1 and T2 are connected to the collectors of the second and first transistors T2 and T1, respectively, via two coupling capacitors Cfb having equal nominal values. The bases of the transistors T1 and T2 receive a bias voltage Vbase via a base resistor Rb. This voltage Vbase may be derived from the voltage of the first power supply terminal VCC by means of, for example, a divider bridge. The passive part comprises two high-pass filters each being inserted between one of the output terminals S1 or S2 and one of the variable capacitances Cs. Each high-pass filter is constituted by a filtering capacitor Cm arranged between one of the output terminals S1 or S2 and one of the variable capacitances Cs, and a resistor Rm arranged between the second power supply terminal GND and a node situated between said variable capacitance Cs and the filtering capacitor Cm.

Such a structure enables the oscillator to be completely integrated within an integrated circuit's housing. The whole structure described above can be integrated within the same integrated circuit, except the inductances Lext connecting the output terminals S1 and S2 of the passive part to the first power supply terminal VCC, which must be realized outside the circuit.

Figure 2:
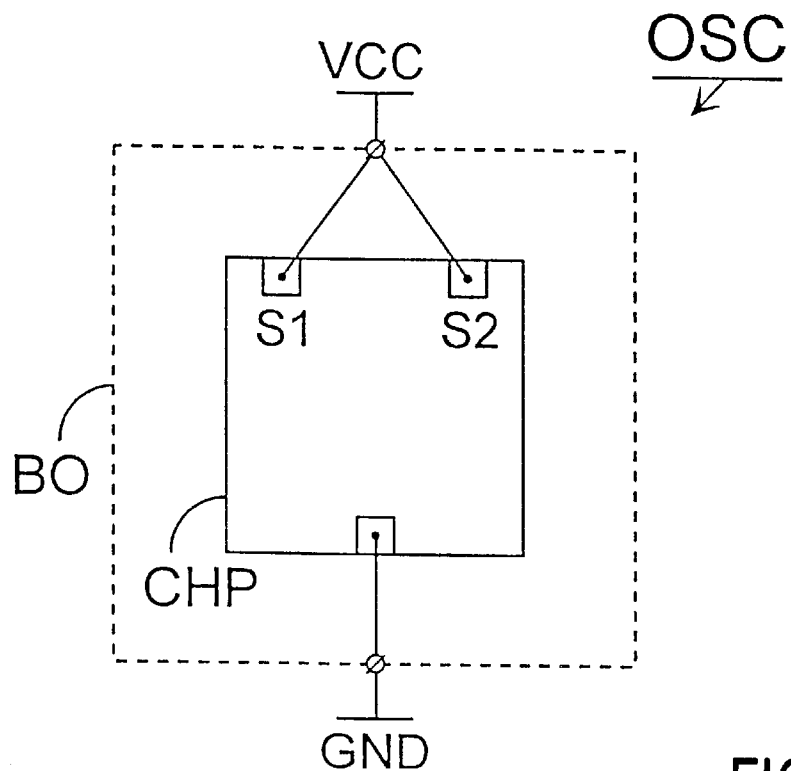
FIG. 2 is a schematic representation of an advantageous embodiment of the invention.

FIG. 2 shows very diagrammatically an advantageous embodiment of the invention in which the active and passive parts of the oscillator OSC are realized within the same integrated circuit CHP incorporated in a housing BO which has a first and a second pin constituting the first and second power supply terminals VCC and GND. The inductances Lext are constituted by conducting wires connecting the output terminals S1 and S2 of the passive part to the first pin VCC of the housing BO. In order to obtain a maximally perfect phase opposition between the signals present at the terminals S1 and S2, the different elements constituting the active and passive parts of the oscillator are advantageously arranged in such a way that they are maximally in accordance with to the symmetry of the electric circuit diagram in FIG. 1.

The complete integration within a single housing of the oscillator OSC enables to avoid the addition of external inductances to the housing, which simplifies the structure of the apparatus using this oscillator and reduces its bulkiness as well as its cost.

Figure 3:
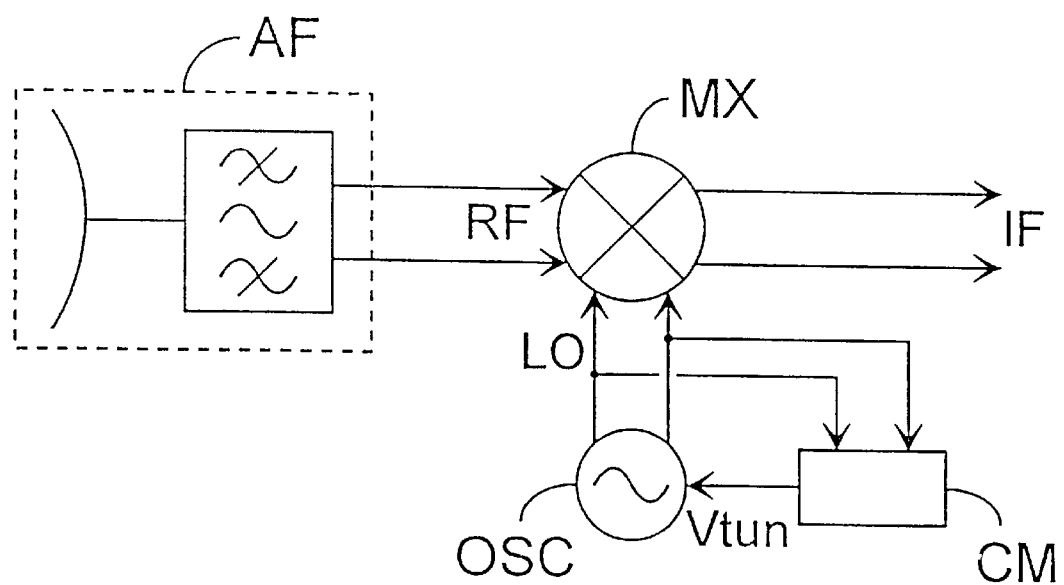
FIG. 3 is a partial diagram of a radio-telephone apparatus using an oscillator according to the invention.

Such an oscillator is thus particularly well adapted to its use within a portable apparatus. FIG. 3 shows an example of application of the invention. It partly shows a radio-telephone apparatus such as a cellular telephone of the GSM type suitable for emitting or receiving radio-electric signals in a given range of frequencies. This apparatus comprises an antenna and filtering system AF with which a signal whose frequency RF is selected from said range of frequencies can be received. A frequency conversion from the RF frequency to be selected proximate to an intermediate frequency IF, is realized in this apparatus by means of a mixer MX receiving the selected radio-electric signal, and a signal LO emitted at the output of a local oscillator OSC as described hereinbefore. The frequency of the signal LO is measured by a control module CM which supplies a tuning voltage Vtun at the output, allowing the frequency of the output signal LO of the local oscillator OSC to be tuned in such a way that it is equal to the difference between the frequency RF to be selected and the intermediate frequency IF.

The complete integration of the oscillator OSC according to the invention and the high spectral purity of the output signal which it supplies enable it to respect the GSM standard which determines a maximal noise level at the output of the oscillator, all this while having a greatly reduced volume.

What is claimed is:

1. An oscillator intended to provide an output signal having a frequency which is variable as a function of a tuning voltage, comprising:

a passive part having two output terminals between which the output signal is taken, and an input terminal intended to receive the tuning voltage, and comprising two series-arranged variable capacitances, thus forming a capacitive branch whose extremities constitute the output terminals, and of which a junction point between the variable capacitances constitutes the input terminal, the output terminals being connected to a first power supply terminal via two inductances having equal nominal values, an active part comprising a first and a second transistor each having a biasing terminal, a reference terminal and an output terminal, the output terminals of the first and second transistors being connected to the output terminals of the passive part, the reference terminals of said transistors being connected to a second power supply terminal via a current source, the biasing terminals of the first and second transistors being connected to the output terminals of the second and first transistors, respectively, via two coupling capacitances having equal nominal values, characterized in that, the first and second transistors being bipolar transistors whose bases, collectors and emitters constitute the biasing terminals, the output terminals and the reference terminals, respectively, the passive part comprises two high-pass filters, each being inserted between one of the collectors and one of the variable capacitances.

2. An oscillator as claimed in claim 1, characterized in that each high-pass filter is constituted by a filtering capacitor arranged between one of the output terminals and one of the variable capacitances, and a resistor arranged between the second power supply terminal and a node situated between said variable capacitance and the filtering capacitor.

3. An oscillator as claimed in claim 1, characterized in that the current source connecting the reference terminals of the first and second transistors to the second power supply terminal is a resistor.

4. An oscillator as claimed in claim 1, characterized in that, the active and passive parts being realized within the same integrated circuit incorporated in a housing having a first and a second pin constituting the first and second power supply terminals and pins connected to the input and output terminals of the integrated circuit, the inductances are constituted by conducting wires connecting the output terminals of the passive part to the first pin of the housing.

5. A radio-telephone apparatus used for emitting or receiving radio-electric signals in a given range of frequencies, which apparatus comprises an antenna and filtering system allowing reception of a signal having a frequency which is selected within said range of frequencies, in which apparatus a frequency conversion, from the frequency to be selected to an intermediate frequency, is realized by means of a mixer receiving the selected radio-electric signal and a signal emitted at the output of a local oscillator, said signal having a frequency which is measured by a control module which supplies a tuning voltage at the output allowing control of the frequency of the output signal of the local oscillator such that said frequency is equal to the difference between the frequency to be selected and the intermediate frequency, wherein the local oscillator is an oscillator intended to provide an output signal having a frequency which is variable as a function of a tuning voltage, comprising:

a passive part having two output terminals between which the output signal is taken, and an input terminal intended to receive the tuning voltage, and comprising two series-arranged variable capacitances, thus forming a capacitive branch whose extremities constitute the output terminals, and of which a junction point between the variable capacitances constitutes the input terminal, the output terminals being connected to a first power supply terminal via two inductances having equal nominal values, an active part comprising a first and a second transistor each having a biasing terminal, a reference terminal and an output terminal, the output terminals of the first and second transistors being connected to the output terminals of the passive part, the reference terminals of said transistors being connected to a second power supply terminal via a current source, the biasing terminals of the first and second transistors being connected to the output terminals of the second and first transistors, respectively, via two coupling capacitances having equal nominal values, characterized in that, the first and second transistors being bipolar transistors whose bases, collectors and emitters constitute the biasing terminals, the output terminals and the reference terminals, respectively, the passive part comprises two high-pass filters, each being inserted between one of the collectors and one of the variable capacitances.

6. An oscillator comprising:

a transistor having a base, an emitter and a collector, said collector being connected to a first power supply and being an output of said oscillator, and said emitter being connected to a second power supply;

a variable capacitance having a first terminal and a second terminal, said first terminal being connected to an input terminal of said oscillator; and a high pass filter connected between said collector and second terminal of said variable capacitance.

7. The oscillator of claim 6, wherein said high pass filter includes a filtering capacitor connected between said collector and said second terminal of said variable capacitance and a resistor connected between said second power supply and said second terminal.

8. The oscillator of claim 6, wherein said transistor, said variable capacitor and said high pass filter are realized within an integrated circuit.

9. The oscillator of claim 8, wherein said integrated circuit has a first pin connected to said first power supply, a second pin connected to said second power supply, a third pin connected to said input terminal, and a fourth pin connected to said collector.

10. The oscillator of claim 6, further including an inductor connected to said collector.

11. The oscillator of claim 10, wherein said inductor is a conducting wire.

Reconsideration of the present application as amended is respectfully requested.

* * * * *